Jan. 12, 1954 M. WALLACE 2,666,140

BEAT FREQUENCY OSCILLATOR

Filed Nov. 16, 1949

*INVENTOR.*

MARCEL WALLACE

*BY* Hyman Hurvitz

Patented Jan. 12, 1954

2,666,140

UNITED STATES PATENT OFFICE 2,666,140

BEAT FREQUENCY OSCILLATOR

Marcel Wallace, Port Chester, Conn.

Application November 16, 1949, Serial No. 127,577

8 Claims. (Cl. 250—36)

This application is a continuation-in-part of my co-pending application Serial No. 684,630, filed July 18, 1946, now Patent No. 2,496,832, and entitled "Radio Receiving Systems with Automatic Tuner."

The present invention relates generally to signal generators, and more particularly to signal generators which are capable of providing signals over a wide range of frequencies by virtue of relatively few adjustments, and with a minimum of spurious response.

It is well known in the prior art to generate a wide range of frequencies by mixing in a frequency converter the outputs of two oscillators, selecting either the sum or the difference frequencies of the oscillators at the output of the mixer. In systems of this kind the problem arises of selecting from the many frequencies which are generated by a mixer, when two frequencies are impressed thereon, that one output frequency which is desired, to the exclusion of spurious responses. It is known that the elimination of spurious responses may be accomplished by providing a tunable filter at the output of the mixer, which selects the desired conversion product and rejects all other frequencies. This filter then must have a tunable range over the entire output range of the signal generator. Design of a filter of this character proves to be an extremely difficult problem, where the range of output frequencies is wide, and accordingly, it is desirable to provide a signal generator system, in which no necessity for tunable filters exists.

Provision of a signal generator which is capable of providing signals over an extremely wide band of frequencies, by mixing the outputs of two oscillators, is solved in accordance with the present invention by proper selection of the frequencies of the two oscillators. The system is of such nature, and the selection so made, that at the output of the mixer there may be employed a low pass filter, all undesired output components derivable from the mixer being falling within the band pass of the filter.

It is a broad object of the present invention to provide a novel signal generator of the heterodyne type, wherein selection of frequencies of the two oscillators, the outputs of which are heterodyned to provide a resultant frequency, are so selected that a simple fixed tuned filter may be utilized to reject most of the undesired responses of the mixer.

Figure 1:
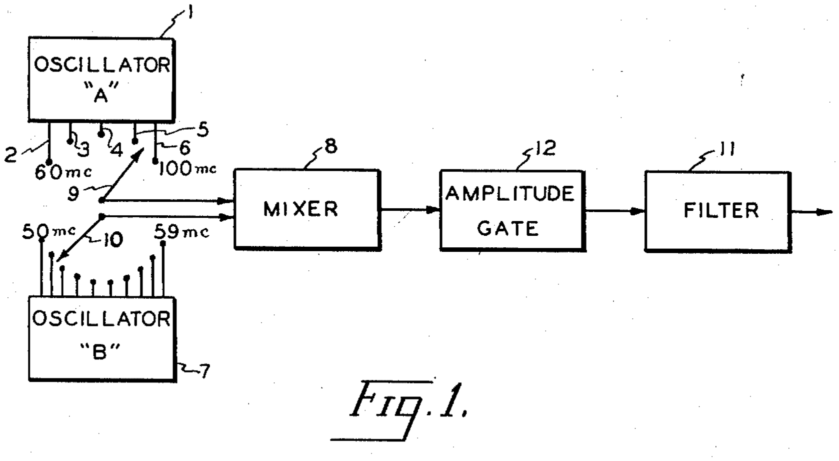
Figure 2:
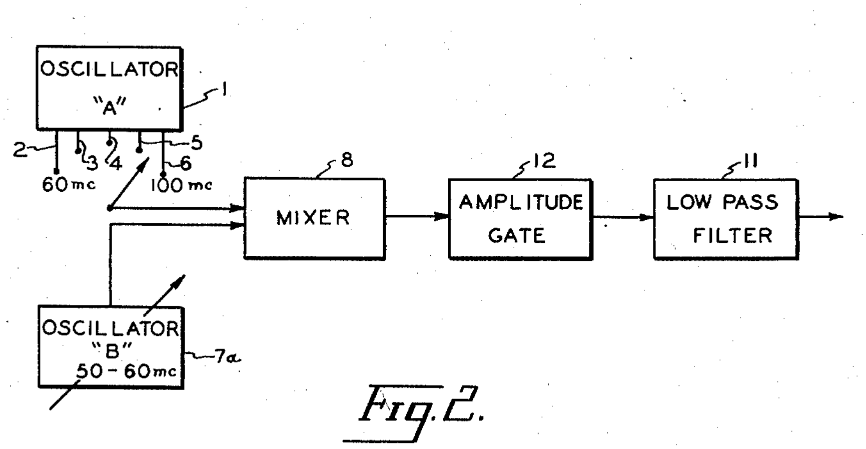

The above and still further objects, features and advantages of the present invention will become evident upon consideration of the following detailed description of two embodiments of the invention, especially when taken in conjunction with the accompanying drawings, wherein:

Figure 1 is a functional block diagram of a first embodiment of the invention, utilized for providing a series of discrete frequencies falling in a wide frequency band, and wherein, Figure 2 is a modification of the system of Figure 1 which is capable of providing a continuously variable band of frequencies rather than a series of discrete frequencies.

Referring now to the drawings, and particularly to Figure 1 thereof, and bearing in mind that specific frequency values are referred to for the purpose of example only, and not by way of limitation on the true scope of the invention, there is provided an oscillator "A" to which is applied the reference numeral 1, and which provides fixed frequencies, separated by increments of 10 megacycles, and which may, for example, comprise a crystal controlled harmonic generator having a fundamental frequency of 10 mc., supplied with output leads 2 to 6, inclusive, at which are available frequencies of 60 mc., 70 mc., 80 mc., 90 mc. and 100 mc. respectively. Signal sources of the above character are well known in the art and require no detailed elucidation for a complete understanding.

There is further provided a second oscillator "B," identified by the reference numeral 7, which provides selectively a plurality of signal outputs differing in frequency in increments of 1 mc., and which may be of the same general construction as oscillator 1, the output frequencies being crystal controlled for accuracy by a 1 mc. crystal. The output range of the oscillator 7 may fall in the band 50 to 59 megacycles inclusive.

It is desired, in the embodiment of my invention illustrated in Figure 1 of the drawings, to provide output frequencies in the range 1 to 49 mc., in one mc. steps or increments.

Upon sufficient consideration of the system which is illustrated in Figure 2 of the drawings, it will be clear that the absolute values of the frequencies selected for oscillators A and B may not be selected at random, since upon converting the outputs of the oscillators A and B at a mixer 8, it it essential that no more than a single product of the conversion be within the desired output range of frequencies for any combined settings of the oscillators A and B. Accordingly, I provide output frequencies of 60 to 100 megacycles in 10 megacycle increments, by selective actuation of the switch arm 9 associated with oscillator "A,"

and frequencies of 50 to 59 mc. in 1 mc. increments by selective actuation of the switch arm 10 associated with oscillator "B." I provide at the output of the mixer 8 a low pass filter 11, which cuts off sharply between 49 and 50 megacycles.

It will be clear, with the arrangement above described, and considering all the possible products of frequency conversion, that but few possible ambiguities of output may occur in the described system. The fundamental and harmonic products of the outputs of each of oscillators A and B, present in the output of mixer 8, fall above the pass band of the filter 11. The sum frequencies generated in the mixer likewise all fall above the pass band of the filter 11. Differences of the fundamental frequencies generated by oscillators A and B all fall within the band pass of the filter 11, and represent the useful output of the signal generator.

When possible higher order products of frequency conversion are considered, in analyzing the operation of the signal generator illustrated in Figure 1, it becomes apparent that ambiguities may be present in the output of the generator due to such higher order products. For example, were it desired to generate a frequency of 8 megacycles in the output of the signal generator, oscillator A would be adjusted to produce an output frequency of 60 megacycles, and oscillator B of 52 megacycles, to provide a difference frequency of 8 megacycles. The second harmonic of 52 megacycles would, however, combine with 60 megacycles to provide a converter output of 44 megacycles. It is well known that higher order products of frequency conversion are of relatively slight amplitude in comparison with first order products, and this fact enables discrimination between desired signals, and undesired high order conversion products. In order to eliminate undesirable high order conversion products from the output of the mixer, I may provide an amplitude gate 12, adjusted to pass only conversion products having amplitudes approximately as great as are possessed by the desired first order conversion products derivable from the mixer 8, thereby enabling discrimination between desired and undesired control signals.

The mixer 8, in the system of Figure 1, may be looked on as a device for subtracting from the output frequency of oscillator 1 the output frequency of oscillator 7. Hence, if oscillator 1 be arranged to provide 60 megacycles, the oscillator 31 may be caused to subtract therefrom values of 59, 58, . . . 50 megacycles, selectively, to produce mixer output products of 1 to . . . 10 megacycles. Upon increasing the output frequency of oscillator 1 to 70 megacycles, difference frequencies of 11 to 20 megacycles may be obtained, in one megacycle steps. For an output of 100 megacycles from oscillator 30 the output frequency of the device is 41 to 50 megacycles in steps of one megacycle.

It will, of course, be realized that the output of the system of Figure 1 may be selected at will to cover an extremely wide band of frequencies in steps of unitary character.

For example, were it desired to produce outputs of 1 to 99 megacycles in 1 megacycle increments, the oscillator A might be designed, in accordance with the principles of the invention, to provide output frequencies of 110, 120, 130 . . . 200 megacycles. The oscillator B on the other hand, might be designed to provide output frequencies of 100, 101, 102 . . . 109 megacycles. Slight reflection is required to demonstrate that the desired output band of 1 to 99 megacycles may be thus attained, without ambiguity of output, except such as may be readily removed by amplitude gate 12.

It will be noted in general that the frequencies available from oscillator A follow immediately after the highest frequency available from oscillator B. It will be further noted that the maximum frequency available from oscillator A is twice the minimum frequency available from oscillator B. There is thus provided the general rule or law of operation in accordance with which selection is made of the frequencies available at the oscillators A and B, and it will be seen that any desired range of frequencies may be provided by utilizing the principles of the invention, and that the specific frequencies specified above, and illustrated in the drawings, are not limiting but are exemplary only.

In Figure 2 of the drawings, precisely the same system is illustrated as in Figure 1 with the exception that oscillator B is now a continuously variable oscillator 7a variable over the range 50 to 60 megacycles, in my example. Thereby the output of the mixer 8 may be made continuously variable, rather than variable by discrete increments.

While I have described two specific embodiments of my invention, it will be clear that various modifications of the arrangement specifically described and illustrated may be resorted to without departing from the spirit of the invention, as defined in the appended claims.

What I claim and desire to secure by Letters Patent of the United States is:

1. In combination, providing a plurality of harmonically related frequencies arranged in an arithmetic series, providing a further plurality of frequencies within a band equal in extent to the frequency difference between two adjacent ones of said harmonically related frequencies, mixing a selected one of said harmonically related frequencies with a selected one of said further frequencies, rejecting from the product of the mixing of said plurality of harmonically related frequencies and said further plurality of frequencies and all sum products of conversion of these, and passing a plurality of difference conversion products of each of said plurality of harmonically related frequencies with each of said further plurality of frequencies.

2. In combination, providing a plurality of discrete frequencies adjacent ones of which are separated by a predetermined frequency difference, providing a plurality of further frequencies selectable over a band having a width falling within said frequency difference, and all falling below the lowermost of said discrete frequencies, mixing a selected one of said discrete frequencies with a selected one of said further frequencies, low-pass filtering conversion products of the mixing step to pass only frequencies adjacent the lowermost of said further frequencies, said discrete frequencies and said further frequencies selected to have no first order conversion product passable in the filtering.

3. A method for providing a selected frequency in a band of frequencies, comprising, providing first discrete signals at frequencies separated by a predetermined frequency difference, providing further signals variable over a band of frequencies equal in range to said frequency difference, the lowermost frequency of said first signals substantially equal to the uppermost frequency of said further signals, heterodyning a selected one of said first discrete signals with a selected one of said further signals, and low pass filtering the output of the mixing operation with a filtering cut-off frequency adjacent the lowermost frequency of said band of frequencies.

4. A method of providing a selected frequency in a band of frequencies, comprising, providing first discrete signals having frequencies of $an$, $(a+1)\ n$, $(a+2)\ n\ .\ .\ .\ (2a-n)$, where $n$ is an integer and a multiple of ten and $a$ is an integer less than ten, and second discrete signals having frequencies in the band $(a-1)\ n$ to $an$, mixing a selected signal from said first source with a selected signal from said second source, and low pass filtering the conversion products with a low pass cut-off frequency below $(a-1)\ n$ cycles per second, to pass all frequencies below $(a-1)\ n$ cycles per second.

5. In combination, providing discrete signals in a first band of frequencies, said band having a lower and an upper limit, said upper limit less than twice said lower limit, adjacent ones of said discrete signals separated by a predetermined frequency difference, providing further signals within a second band extending from half said upper limit to said lower limit and equal in extent to said frequency difference, mixing one frequency from said first band with one frequency from said second band, and low pass filtering the conversion products to pass only frequencies up to half said upper limit.

6. A method of generating oscillations continuously variable in the band 0 to $10^a n$ cycles, where $a$ is a positive integer and $n$ a selected integer, comprising providing oscillations at discrete frequencies of $10^a\ (n+1)$, $10^a\ (n+2)\ .\ .\ .\ 10^a\ 2n$, in cycles per second, providing oscillations variable over the band $10^a n$ to $10^a\ (n+1)$, and so mixing and filtering said oscillations as to generate only a different frequency between any selected frequency in said first mentioned band and any selected frequency in said second mentioned band.

7. A method of generation for providing a selected frequency in a band of frequencies, comprising, providing first signals having frequencies of $an$, $(a+1)$, $(a+2)\ n,\ .\ .\ .\ (a+s)\ n$, where $a$ is a numeral less than 10, where $s$ is a numeral less than 9, where $n$ is an integral multiple of 10, including 10, providing second signals variable in frequency and extending over a band having an upper value at $an$, and a lower value at $(a-1)n$, selecting one of said first signals and one of said second signals, heterodyning the selected signals with one another, and removing from the heterodyne product frequencies all frequencies above $(a-1)\ n$.

8. A method of signal generation for providing a series of frequencies, the values of which increase in arithmetical progression and cover a predetermined frequency spectrum, comprising, providing signals at discrete frequencies over a first frequency range, providing signals at discrete frequencies over a second frequency range, said second frequency range at its lower limit providing an extension of said first frequency range, and the frequency difference between adjacent ones of said last mentioned discrete frequencies ten times the frequency difference between adjacent ones of said first mentioned discrete frequencies, mixing one signal only from each of said bands, and low pass filtering the result of mixing and with a cut-off frequency at the lower edge of said first mentioned frequency spectrum.

MARCEL WALLACE.

References Cited in the file of this patent

UNITED STATES PATENTS

| Number | Name | Date |
|---|---|---|
| 1,901,043 | Roosenstein | Mar. 14, 1933 |
| 2,252,870 | Slonczewski | Aug. 19, 1941 |
| 2,265,083 | Peterson | Dec. 2, 1941 |
| 2,270,023 | Ramsay et al. | Jan. 13, 1942 |
| 2,401,481 | Harnett | June 4, 1946 |
| 2,481,900 | Blok | Sept. 13, 1949 |
| 2,487,857 | Davis | Nov. 15, 1949 |
| 2,501,591 | Bach | Mar. 21, 1950 |
| 2,509,963 | Collins | May 30, 1950 |

FOREIGN PATENTS

| Number | Country | Date |
|---|---|---|
| 126,072 | Australia | Nov. 27, 1947 |